(12) United States Patent
Yang et al.

(10) Patent No.: US 8,493,100 B2
(45) Date of Patent: Jul. 23, 2013

(54) OUTPUT DRIVER

(75) Inventors: Ji Yeon Yang, Seoul (KR); Dong Uk Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 104 days.

(21) Appl. No.: 13/034,328

(22) Filed: Feb. 24, 2011

(65) Prior Publication Data

US 2012/0062280 A1  Mar. 15, 2012

(30) Foreign Application Priority Data

Sep. 10, 2010  (KR) .................... 10-2010-0089111

(51) Int. Cl.
*H03B 1/00*  (2006.01)

(52) U.S. Cl.
USPC .. 327/108; 327/112; 365/189.05; 365/189.17

(58) Field of Classification Search
None
See application file for complete search history.

(56) References Cited

U.S. PATENT DOCUMENTS

| | | | |
|---|---|---|---|
| 6,330,194 B1 * | 12/2001 | Thomann et al. | 365/189.05 |
| 7,355,448 B2 * | 4/2008 | Chun | 326/82 |
| 7,911,225 B2 * | 3/2011 | Ahn et al. | 326/30 |
| 2010/0097094 A1 | 4/2010 | Jang | |

FOREIGN PATENT DOCUMENTS

| | | |
|---|---|---|
| KR | 100733461 B1 | 6/2007 |
| KR | 1020080089072 A | 10/2008 |
| KR | 1020080108853 A | 12/2008 |
| KR | 1020090000511 A | 1/2009 |
| KR | 1020090015724 A | 2/2009 |
| KR | 1020090017223 A | 2/2009 |
| KR | 1020090061325 A | 6/2009 |

* cited by examiner

*Primary Examiner* — An Luu
(74) *Attorney, Agent, or Firm* — William Park & Associates Patent Ltd.

(57) ABSTRACT

An output driver includes a control signal generation unit configured to generate a control signal in response to a driving strength signal and a power supply voltage level, and a driving signal generation unit configured to buffer a pre-driving signal and generate a driving signal for driving an output data, wherein a driving strength of the driving signal is adjusted in response to the control signal.

22 Claims, 7 Drawing Sheets

2

OUTPUT DRIVER

CROSS-REFERENCES TO RELATED APPLICATIONS

The present application claims priority under 35 U.S.C 119(a) to Korean Application No. 10-2010-0089111, filed on Sep. 10, 2010, in the Korean intellectual property Office, which is incorporated herein by reference in its entirety set forth in full.

BACKGROUND

A semiconductor device includes a data output driver which outputs data to the outside in an output operation. The data output driver drives data to a target voltage and then output the driven data, considering a loading of a data transmission path.

A slew rate refers to the degree of voltage variation during a time taken until data driven by the data output driver reaches a target voltage. The slew rate represents how fast a voltage level of an output signal changes, that is, a slope of a voltage graph with respect to time. The slew rate may be classified into an up slew rate and a down slew rate. The up slew rate refers to a slope when an output voltage level changes from a low level to a high level, and the down slew rate refers to a slope when an output voltage level changes from a high level to a low level. As the slew rate is higher, an absolute value of the voltage graph becomes larger. This means that the output voltage level rapidly changes in a short time.

FIG. 1 is a block diagram of a known output driver.

As illustrated in FIG. 1, the known output driver includes a driving signal generation unit 1 and a driving unit 2. The driving signal generation unit 1 is configured to receive input data Din and generate first to third pull-up signals PU<1:3> and first to third pull-down signals PD<1:3> in response to first to third driving strength signals STCTRL<1:3>. The driving unit 2 is configured to drive output data Dout in response to the first to third pull-up signals PU<1:3> and the first to third pull-down signals PD<1:3>.

As illustrated in FIG. 2, the driving unit 2 includes a PMOS transistor P1, an NMOS transistor N1, a PMOS transistor P2, an NMOS transistor N2, a PMOS transistor P3, and an NMOS transistor N3. The PMOS transistor P1 is configured to pull up the voltage of the output data Dout in response to the first pull-up signal PU<1>. The NMOS transistor N1 is configured to pull down the voltage of the output data Dout in response to the first pull-down signal PD<1>. The PMOS transistor P2 is configured to pull up the voltage of the output data Dout in response to the second pull-up signal PU<2>. The NMOS transistor N2 is configured to pull down the voltage of the output data Dout in response to the second pull-down signal PD<2>. The PMOS transistor P3 is configured to pull up the voltage of the output data Dout in response to the third pull-up signal PU<3>. The NMOS transistor N3 is configured to pull down the voltage of the output data Dout in response to the third pull-down signal PD<3>. Among the PMOS transistors P1 to P3, the PMOS transistor P3 has the largest size and the PMOS transistor P1 has the smallest size. In addition, among the NMOS transistors N1 to N3, the NMOS transistor N3 has the largest size and the NMOS transistor N1 has the smallest size.

The first to third driving strength signals STCTRL<1:3> are set by a mode register set, and the driving strength of the output driver is adjusted to one of "FULL", "HALF", and "WEAK" according to the first to third driving strength signals STCTRL<1:3>. The operation of adjusting the driving strength of the output driver according to the first to third driving strength signals STCTRL<1:3> will be described below in detail.

When the first driving strength signal STCTRL<1> is enabled to a logic high level and the input data Din is at a logic high level, the first pull-up signal PU<1> is enabled to a logic low level. When the input data Din is at a logic low level, the first pull-down signal PD<1> is enabled to a logic high level. Therefore, when the input data Din is at a logic high level, the PMOS transistor P1 of the driving unit 2 becomes turned on, and drives the output data Dout. When the input data Din is at a logic low level, the NMOS transistor N1 of the driving unit 2 becomes turned on, and drives the output data Dout. Since the PMOS transistor P1 among the PMOS transistors P1 to P3 has the smallest size and the NMOS transistor N1 among the NMOS transistors N1 to N3 has the smallest size, the driving unit 2 drives the output data Dout with the weakest driving strength "WEAK" when the first driving strength signal STCTRL<1> is enabled to a logic high level.

Next, when the second driving strength signal STCTRL<2> is enabled to a logic high level and the input data Din is at a logic high level, the second pull-up signal PU<2> is enabled to a logic low level. When the input data Din is at a logic low level, the second pull-down signal PD<2> is enabled to a logic high level. Therefore, when the input data Din is at a logic high level, the PMOS transistor P2 of the driving unit 2 becomes turned on, and drives the output data Dout. When the input data Din is at a logic low level, the NMOS transistor N2 of the driving unit 2 becomes turned on, and drives the output data Dout. Since the PMOS transistor P2 is larger than the PMOS transistor P1 and smaller than the PMOS transistor P3 and the NMOS transistor N2 is larger than the NMOS transistor N1 and smaller than the NMOS transistor N3, the driving unit 2 drives the output data Dout with the driving strength "HALF" higher than "WEAK" and lower than "FULL", when the second driving strength signal STCTRL<2> is enabled to a logic high level.

Next, when the third driving strength signal STCTRL<3> is enabled to a logic high level and the input data Din is at a logic high level, the third pull-up signal PU<3> is enabled to a logic low level. When the input data Din is at a logic low level, the third pull-down signal PD<3> is enabled to a logic high level. Therefore, when the input data Din is at a logic high level, the PMOS transistor P3 of the driving unit 2 becomes turned on, and drives the output data Dout. When the input data Din is at a logic low level, the NMOS transistor N3 of the driving unit 2 becomes turned on, and drives the output data Dout. Since the PMOS transistor P3 among the PMOS transistors P1 to P3 has the largest size and the NMOS transistor N3 among the NMOS transistors N1 to N3 has the largest size, the driving unit 2 drives the output data Dout with the strongest driving strength "FULL" when the third driving strength signal STCTRL<3> is enabled to a logic high level.

As described above, the known output driver drives the output data with the driving strength adjusted by the first to third driving strength signals STCTRL<1:3> set by the mode register set. Therefore, the slew rate of the output data Dout is also adjusted by the first to third driving strength signals STCTRL<1:3>.

However, when the level of the power supply voltage VDD changes, the driving strength of the output driver supplied with the power supply voltage VDD may change and thus the slew rate of the output data Dout may be influenced. For example, even though the third driving strength signal STCTRL<3> is set to a logic high level, and thus the driving strength of the output driver is set to "FULL", the driving strength of the output driver may decrease if the level of the power supply voltage VDD is low. Consequently, the slew rate of the output data Dout may also decrease. The reduction of the slew rate according to the level of the power supply voltage VDD may cause distortion in the waveform of the output data Dout.

SUMMARY

An embodiment of the present invention is directed to an output driver which can drive output data having a substantially constant slew rate, without regard to change in a power supply voltage level.

In an exemplary embodiment, an output driver includes a control signal generation unit configured to generate a control signal in response to a driving strength signal and a power supply voltage level, and a driving signal generation unit configured to buffer a pre-driving signal and generate a driving signal for driving an output data, wherein a driving strength of the driving signal is adjusted in response to the control signal.

In another exemplary embodiment, an output driver includes a control signal generation unit configured to generate a control signal in response to a driving strength signal and a power supply voltage level, a first data driving unit configured to receive input data and generate a first driving signal for driving output data, wherein a driving strength of the first driving signal is adjusted in response to the control signal, and a second data driving unit configured to receive the input data and generate a second driving signal for driving the output data, wherein a driving strength of the second driving signal is adjusted in response to the control signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
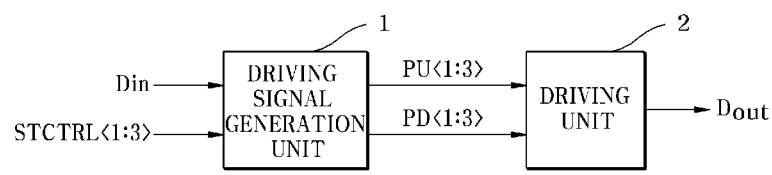
FIG. 1 is a block diagram of a known output driver.
Figure 2:
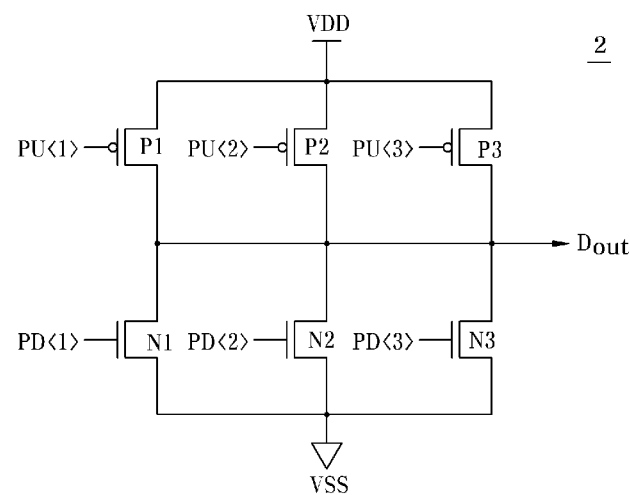
FIG. 2 is a circuit diagram of a driving unit illustrated in FIG. 1.
Figure 3:
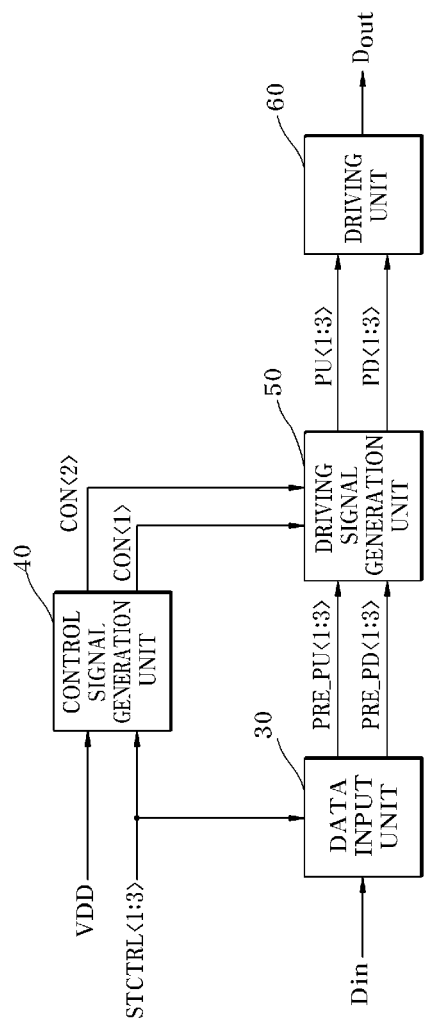
FIG. 3 is a block diagram of an output driver according to an exemplary embodiment of the present invention.

FIG. 3 is a block diagram of an output driver according to an exemplary embodiment of the present invention.

As illustrated in FIG. 3, the output driver according to the exemplary embodiment of the present invention includes a data input unit 30, a control signal generation unit 40, a driving signal generation unit 50, and a driving unit 60.

Figure 4:
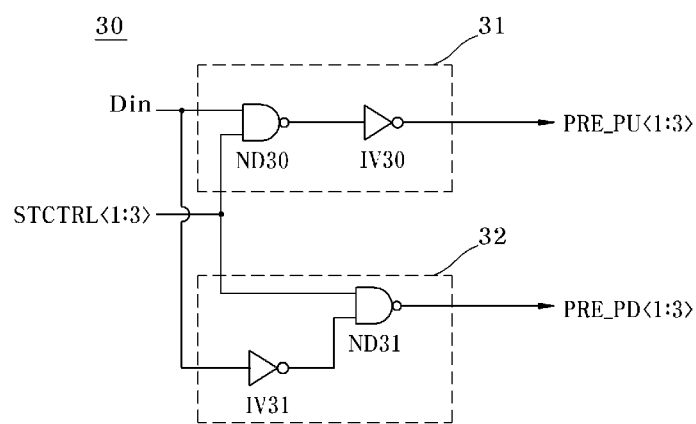
FIG. 4 is an exemplary circuit diagram of a data input unit illustrated in FIG. 3.

As illustrated in FIG. 4, the data input unit 30 includes a pre-pull-up driving signal generation unit 31 and a pre-pull-down driving signal generation unit 32.

The pre-pull-up driving signal generation unit 31 includes a first NAND gate ND30 and a first inverter IV30. The first NAND gate ND30 is configured to perform a NAND operation on input data Din and driving strength signals STCTRL<1:3>. The first inverter IV30 is configured to invert and buffer an output signal of the first NAND gate ND30 and output pre-pull-up driving signals PRE_PU<1:3>. When the driving strength signals STCTRL<1:3> are at a logic high level, the pre-pull-up driving signal generation unit 31 buffers the input data Din, and outputs the pre-pull-up driving signals PRE_PU<1:3>. When the driving strength signals STCTRL<1:3> are at a logic low level, the pre-pull-up driving signal generation unit 31 outputs the pre-pull-up driving signals PRE_PU<1:3> disabled to a logic low level, regardless of the logic level of the input data Din.

The pre-pull-down driving signal generation unit 32 includes a second inverter IV31 and a second NAND gate ND31. The second inverter IV31 is configured to invert and buffer the input data Din. The second NAND gate ND31 is configured to perform a NAND operation on an output signal of the second inverter IV31 and the driving strength signals STCTRL<1:3>, and output pre-pull-down driving signals PRE_PD<1:3>. When the driving strength signals STCTRL<1:3> are at a logic high level, the pre-pull-down driving signal generation unit 32 buffers the input data Din, and outputs the pre-pull-down driving signals PRE_PD<1:3>. When the driving strength signals STCTRL<1:3> are at a logic low level, the pre-pull-down driving signal generation unit 32 outputs the pre-pull-down driving signals PRE_PD<1:3> disabled to a logic high level, regardless of the logic level of the input data Din.

Figure 5:
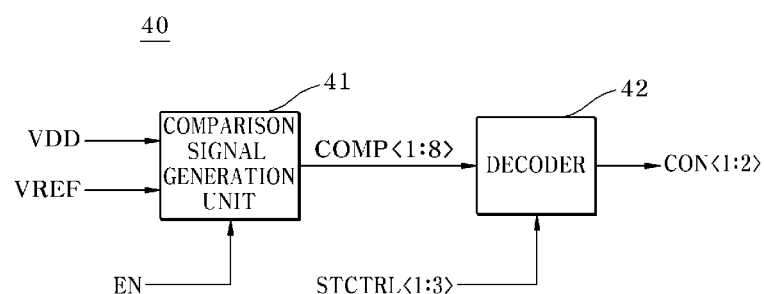
FIG. 5 is an exemplary bock diagram of a control signal generation unit illustrated in FIG. 3.

As illustrated in FIG. 5, the control signal generation unit 40 includes a comparison signal generation unit 41 and a decoder 42.

Figure 6:
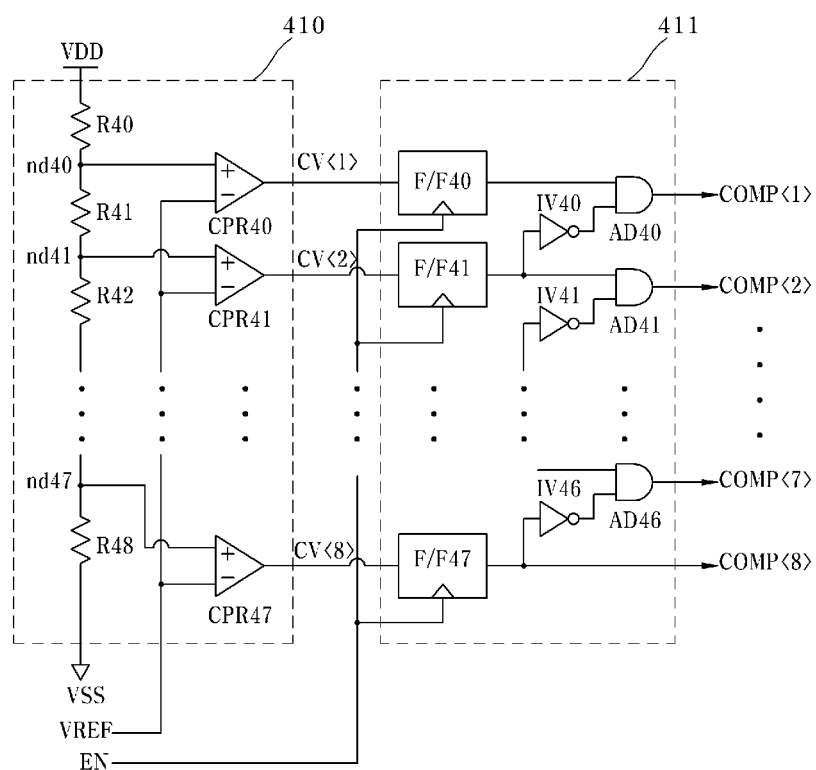
FIG. 6 is an exemplary circuit diagram of a comparison signal generation unit illustrated in FIG. 5.

As illustrated in FIG. 6, the comparison signal generation unit 41 includes a comparison section 410 and a comparison signal output section 411.

The comparison section 410 includes first to ninth resistors R40 to R48 and first to eighth comparators CPR40 to CPR47. The first to ninth resistors R40 to R48 are coupled in series between the power supply voltage (VDD) terminal and the ground voltage (VSS) terminal, and configured to divide the power supply voltage VDD. The first to eighth comparators CPR40 to CPR47 are configured to compare the divided voltages of first to eighth nodes nd40 to nd47 with a reference voltage VREF, and generate comparison voltages CV<1:8>.

The comparison signal output section 411 includes first to eighth flip-flops F/F40 to F/F47, third to ninth inverters IV40 to IV46, and first to seventh AND gates AD40 to AD46. The first to eighth flip-flops F/F40 to F/F47 are configured to transfer the comparison voltages CV<1:8> in response to a logic high level of an enable signal EN. The third to ninth inverters IV40 to IV46 are configured to invert and buffer output signals of the second to eighth flip-flops F/F41 to F/F47. The first to seventh AND gates AD40 to AD46 are configured to perform an AND operation on output signals of the first to eighth flip-flops F/F40 to F/F47 and output signals of the third to ninth inverters IV40 to IV46 and generate comparison signals COMP<1:8>. The enable signal EN is a signal which is enabled to a logic high level during a period in which at least one of the first to third driving strength signals STCTRL<1:3> is enabled to a logic high level in the mode register set.

The operation of the comparison signal generation unit 41 will be described below on the assumption that the power supply voltage VDD is 1.8 V and the reference voltage VREF is 1.0 V.

The first to ninth resistors R40 to R48 of the comparison section 410 divide the power supply voltage VDD of 1.8 V and generate the division voltages of 1.6 V to 0.2 V at the first to eighth nodes nd40 to nd47. The first to third comparators CPR40 to CPR42 compare the reference voltage VREF with the voltages of the first to third nodes nd40 to nd42, which are higher than the reference voltage VREF of 1.0 V, and output the first to third comparison voltages CV<1:3> of a logic high level, i.e., "H, H, H". In addition, the fourth to eighth comparators CPR43 to CPR47 compare the reference voltage VREF with the voltages of the fourth to eighth nodes nd43 to nd47, which are equal to or higher than the reference voltage VREF of 1.0 V, and output the fourth to eighth comparison voltages CV<4:8> of a logic low level, i.e., "L, L, L, L, L". That is, the comparison voltages CV<1:8> of "H, H, H, L, L, L, L, L" are generated. This means that the first comparison voltage CV<1> is "H", the second comparison voltage CV<2> is "H", the third comparison voltage CV<3> is "H", the fourth comparison voltage CV<4> is "L", the fifth comparison voltage CV<5> is "L", the sixth comparison voltage CV<6> is "L", the seventh comparison voltage CV<7> is "L", and the eighth comparison voltage CV<8> is "L".

The first to ninth resistors R40 to R48 have the same resistance, and the reference voltage VREF has a stable voltage having a constant level, which is not influenced by PVT variations.

Table 1 below shows the signal levels of the comparison voltages CV<1:8> according to the set power supply voltage VDD when the reference voltage is 1.0 V.

TABLE 1

| VREF (1.0 V) | CV<1> | CV<2> | CV<3> | CV<4> | CV<5> | CV<6> | CV<7> | CV<8> |
|---|---|---|---|---|---|---|---|---|
| VDD (1.4 V) | H | H | L | L | L | L | L | L |
| VDD (1.8 V) | H | H | H | L | L | L | L | L |

The first to eighth flip-flops F/F40 to F/F47 of the comparison signal output section 411 transfer the first to eighth comparison voltages CV<1:8> of "H, H, H, L, L, L, L, L" in response to a logic high level of the enable signal EN.

The first AND gate AD40 performs an AND operation on the logic high level of the first comparison voltage CV<1> and the inverted and buffered logic level (i.e., the logic low level) of the second comparison voltage CV<2>, and generates the first comparison signal COMP<1> having a logic low level. The second AND gate AD41 performs an AND operation on the logic high level of the second comparison voltage CV<2> and the inverted and buffered logic level (i.e., the logic low level) of the third comparison voltage CV<3>, and generates the second comparison signal COMP<2> having a logic low level. The third AND gate AD42 performs an AND operation on the logic high level of the third comparison voltage CV<3> and the inverted and buffered logic level (i.e., the logic high level) of the fourth comparison voltage CV<4>, and generates the third comparison signal COMP<3> having a logic high level. The fourth AND gate AD43 performs an AND operation on the logic low level of the fourth comparison voltage CV<4> and the inverted and buffered logic level (i.e., the logic high level) of the fifth comparison voltage CV<5>, and generates the fourth comparison signal COMP<4> having a logic low level. The fifth to seventh AND gates AD44 to AD46 perform the AND operation in the same manner as the fourth AND gate AD43, and generate the fourth to seventh comparison signals COMP<4:7> having a logic low level. In addition, the logic low level of the eighth comparison voltage CV<8> is transferred as the eighth comparison signal COMP<8>.

That is, the comparison signals COMP<1:8> of "L, L, H, L, L, L, L, L" are generated. This means that the first comparison signal COMP<1> is "L", the second comparison signal COMP<2> is "L", the third comparison signal COMP<3> is "H", the fourth comparison signal COMP<4> is "L", the fifth comparison signal COMP<5> is "L", the sixth comparison signal COMP<6> is "L", the seventh comparison signal COMP<7> is "L", and the eighth comparison signal COMP<8> is "L".

Table 2 below shows the signal levels of the comparison signals COMP<1:8> according to the power supply voltage VDD when the reference voltage VREF is 1.0 V.

TABLE 2

| VREF (1.0 V) | COMP<1> | COMP<2> | COMP<3> | COMP<4> | COMP<5> | COMP<6> | COMP<7> | COMP<8> |
|---|---|---|---|---|---|---|---|---|
| VDD (1.4 V) | L | H | L | L | L | L | L | L |
| VDD (1.8 V) | L | L | H | L | L | L | L | L |

The decoder 42 generates the control signals CON<1:2> by decoding the comparison signals COMP<1:8>, which are generated by the level of the power supply voltage VDD, and the driving strength signals STCTRL<1:3> having driving strength information.

The operation of the decoder 42 will be described below on the assumption that the power supply voltage is 1.8 V, the reference voltage VREF is 1.0 V, and the driving strength is "WEAK".

When the driving strength is "WEAK", the decoder 42 decodes the driving strength signals STCTRL<1:3> of "H, L, L" and the comparison signals COMP<1:8> of "L, L, H, L, L, L, L, L" and generates the first control signal CON<1> having a logic high level and the second control signal CON<2> having a logic low level.

Table 3 below shows the signal levels of the driving strength signals STCTRL<1:3> according to the driving strength generated in the mode register set, and Table 4 below shows the signal levels of the control signals CON<1:2> according to the power supply voltage VDD and the driving strength signals STCTRL<1:3>.

TABLE 3

|  | STCTRL<1> | STCTRL<2> | STCTRL<3> |
|---|---|---|---|
| FULL | L | L | H |
| HALF | L | H | L |
| WEAK | H | L | L |

TABLE 4

|  | VDD (1.4 V) | | VDD (1.8 V) | |
|---|---|---|---|---|
|  | CON<1> | CON<2> | CON<1> | CON<2> |
| FULL | H | L | L | L |
| HALF | H | L | H | L |
| WEAK | H | H | H | L |

Figure 7:
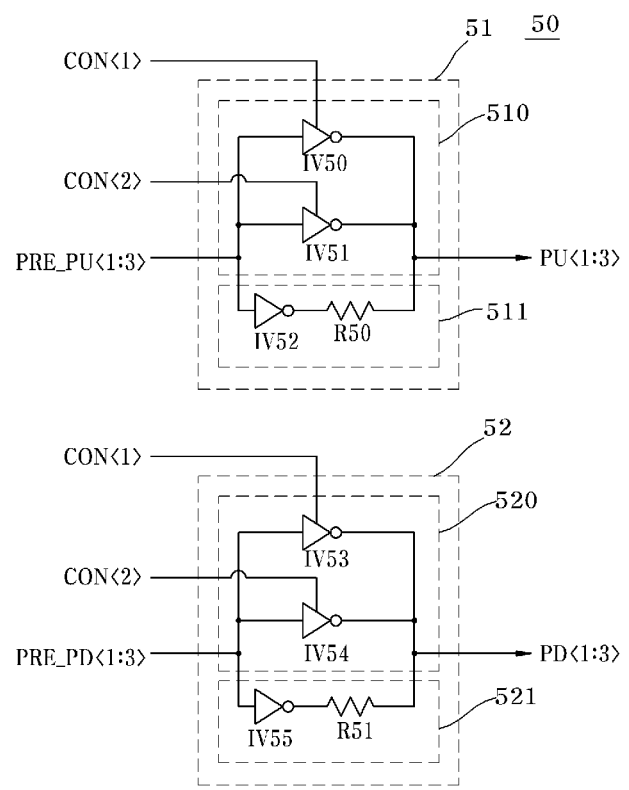
FIG. 7 is an exemplary circuit diagram of a driving signal generation unit illustrated in FIG. 3.

As illustrated in FIG. 7, the driving signal generation unit 50 includes a pull-up driving signal generation unit 51 and a pull-down driving signal generation unit 52.

The pull-up driving signal generation unit 51 includes a first transfer section 510 and a second transfer section 511.

The first transfer unit 510 includes a tenth inverter IV50 and an eleventh inverter IV51. The tenth inverter IV50 is configured to invert and buffer the pre-pull-up driving signals PRE_PU<1:3> in response to the logic high level of the first control signal CON<1>, and output the pull-up driving signals PU<1:3>. The eleventh inverter IV51 is configured to invert and buffer the pre-pull-up driving signal PRE_PU<1:3> in response to the logic high level of the second control signal CON<2>, and output the pull-up driving signals PU<1:3>.

When the first control signal CON<1> is at a logic high level and the second control signal CON<2> is at a logic high level, the first transfer section 510 inverts and buffers the pre-pull-up driving signals PRE_PU<1:3> with a first driving strength, and outputs the pull-up driving signals PU<1:3> whose driving strength is adjusted to the highest level. When the first control signal CON<1> is at a logic high level and the second control signal CON<2> is at a logic low level, the first transfer section 510 inverts and buffers the pre-pull-up driving signals PRE_PU<1:3> with a second driving strength, and outputs the pull-up driving signals PU<1:3> whose driving strength is adjusted to be lower than the first driving strength. In addition, when both the first control signal CON<1> and the second control signal CON<2> are at a logic low level, the tenth inverter IV50 and the eleventh inverter IV51 are not driven, and thus the pre-pull-up driving signals PRE_PU<1:3> are not outputted as the pull-up driving signals PU<1:3>.

The second transfer section 511 includes a twelfth inverter IV52 and a tenth resistor R50 which are configured to invert and buffer the pre-pull-up driving signals PRE_PU<1:3>. The second transfer unit 511 inverts and buffers the pre-pull-up driving signals PRE_PU<1:3> with a third driving strength, and outputs the pull-up driving signals PU<1:3> whose driving strength is adjusted to the lowest level.

Here, the pull-up driving signals PU<1:3> are generated by mixing the output signals of the first transfer section 510 and the second transfer section 511.

The pull-down driving signal generation unit 52 includes a third transfer section 520 and a fourth transfer section 521.

The third transfer unit 520 includes a thirteenth inverter IV53 and a fourteenth inverter IV54. The thirteenth inverter IV53 is configured to invert and buffer the pre-pull-down driving signals PRE_PD<1:3> in response to the logic high level of the first control signal CON<1>, and output the pull-down driving signals PD<1:3>. The fourteenth inverter IV54 is configured to invert and buffer the pre-pull-down driving signal PRE_PD<1:3> in response to the logic high level of the second control signal CON<2> and output the pull-down driving signals PD<1:3>.

When the first control signal CON<1> is at a logic high level and the second control signal CON<2> is at a logic high level, the third transfer section 520 inverts and buffers the pre-pull-down driving signals PRE_PD<1:3> with a first driving strength, and outputs the pull-down driving signals PD<1:3> whose driving strength is adjusted to the highest level. In addition, when the first control signal CON<1> is at a logic high level and the second control signal CON<2> is at a logic low level, the third transfer section 520 inverts and buffers the pre-pull-down driving signals PRE_PD<1:3> with a second driving strength, and outputs the pull-down driving signals PD<1:3> whose driving strength is adjusted to be lower than the first driving strength. Meanwhile, when both the first control signal CON<1> and the second control signal CON<2> are at a logic low level, the thirteenth inverter IV53 and the fourteenth inverter IV54 are not driven, and thus the pre-pull-down driving signals PRE_PD<1:3> are not outputted as the pull-down driving signals PD<1:3>.

The fourth transfer section 521 includes a fifteenth inverter IV55 and an eleventh resistor R51 which are configured to invert and buffer the pre-pull-down driving signals PRE_PD<1:3>. The fourth transfer unit 521 inverts and buffers the pre-pull-down driving signals PRE_PD<1:3> with a third driving strength, and outputs the pull-down driving signals PD<1:3> whose driving strength is adjusted to the lowest level.

Here, the pull-down driving signals PD<1:3> are generated by mixing the output signals of the third transfer section 520 and the fourth transfer section 521.

When the first control signal CON<1> is at a logic high level and the second control signal CON<2> is at a logic high level, the driving signals PU<1:3> and PD<1:3> are generated with the first driving strength, which is the highest driving strength. When the first control signal CON<1> is at a logic high level and the second control signal CON<2> is at a logic low level, the driving signals PU<1:3> and PD<1:3> are generated with the second driving strength, which is lower than the first driving strength and higher than the third driving strength. When the first control signal CON1 is at a logic low level and the second control signal CON2 is at a logic low level, the driving signals PU<1:3> and PD<1:3> are generated with the third driving strength, which is the lowest driving strength.

Figure 8:
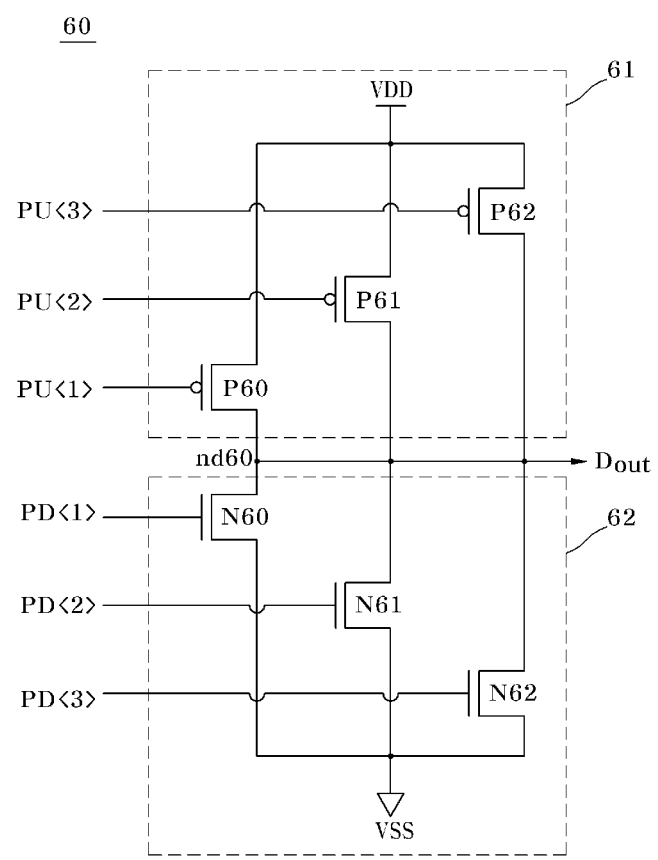
FIG. 8 is an exemplary circuit diagram of a driving unit illustrated in FIG. 3.

As illustrated in FIG. 8, the driving unit 60 includes a pull-up driving unit 61 and a pull-down driving unit 62.

The pull-up driving unit 61 includes first to third pull-up elements P60 to P62. The first to third pull-up elements P60 to P62 are coupled between the power supply voltage (VDD) terminal and a node nd60, and configured to pull up the voltage of the node nd60, and output the output data Dout in response to the pull-up driving signals PU<1:3> whose driving strength is adjusted.

The pull-down driving unit 62 includes first to third pull-down elements N60 to N62. The first to third pull-down elements N60 to N62 are coupled between the node n60 and the ground voltage (VSS) terminal, and configured to pull-down the voltage of the node nd60, and output the output data Dout in response to the pull-down driving signals PD<1:3> whose driving strength is adjusted.

In the driving unit 60, according to an example, the size of the first pull-up element P60 is smallest, and the size of the pull-up elements increases in order of the second pull-up element P61 and the third pull-up element P60. In addition, the size of the first pull-down element N60 is smallest, and the size of the pull-down elements increases in order of the second pull-down element N61 and the third pull-down element N62. The increase of the size causes the increase of the driving strength.

The operation of the output driver according to the exemplary embodiment of the present invention will be described below with reference to FIGS. 3 to 8. It is assumed that the input data Din having a logic low level is inputted, the power supply voltage VDD is 1.8 V, the reference voltage VREF is 1.0 V, and the driving strength is set to "WEAK".

The pre-pull-up driving signal generation unit 31 of the data input unit 30 receives the logic low level "L" of the input data Din and the driving strength signals STCTRL<1:3> of "H, L, L", which correspond to the weak driving strength, and generates the pre-pull-up driving signals PRE_PU<1:3> of "L, L, L". The pre-pull-down driving signal generation unit 12 receives the logic low level "L" of the input data Din and the driving strength signals STCTRL<1:3> of "H, L, L", which correspond to the weak driving strength, and generates the pre-pull-down driving signals PRE_PD<1:3> of "L, H, H".

The driving strength signals STCTRL<1:3> of "H, L, L" mean that the first driving strength signal STCTRL<1> is "H", the second driving strength signal STCTRL<2> is "L", and the third driving strength signal STCTRL<3> is "L". The pre-pull-up driving signals PRE_PU<1:3> of "L, L, L" mean that the first pre-pull-up driving signal PRE_PU<1> is "L", the second pre-pull-up driving signal PRE_PU<2> is "L", and the third pre-pull-up driving signal PRE_PU<3> is "L". The pre-pull-down driving signals PRE_PD<1:3> of "L, H, H" mean that the first pre-pull-down driving signal PRE_PD<1> is "L", the second pre-pull-down driving signal PRE_PD<2> is "H", and the third pre-pull-down driving signal PRE_PD<3> is "H".

The comparator 410 divides the voltage of 1.8 V through the first to ninth resistors R20 to R28, and generates the division voltages of 1.6 V to 0.2 V at the first to eighth nodes nd40 to nd47. The first to third comparators CPR40 to CPR42 compare the reference voltage VREF with the voltages of the first to third nodes nd40 to nd42, which are higher than the reference voltage VREF of 1.0 V, and output the first to third comparison voltages CV<1:3> of a logic high level. The fourth to eighth comparators CPR43 to CPR47 compare the reference voltage VREF with the voltages of the fourth to eighth nodes nd43 to nd47, which are equal to or higher than the reference voltage VREF of 1.0 V, and output the fourth to eighth comparison voltages CV<4:8> of a logic low level. That is, the comparison voltages CV<1:8> of "H, H, H, L, L, L, L, L" are generated as shown in Table 1 above as in the case in which the power supply voltage VDD is 1.8 V and the reference voltage VREF is 1.0 V. This means that the first comparison voltage CV<1> is "H", the second comparison voltage CV<2> is "H", the third comparison voltage CV<3> is "H", the fourth comparison voltage CV<4> is "L", the fifth comparison voltage CV<5> is "L", the sixth comparison voltage CV<6> is "L", the seventh comparison voltage CV<7> is "L", and the eighth comparison voltage CV<8> is "L".

The first to third flip-flops F/F40 to F/F42 of the comparison signal output section 411 transfer the first to third comparison voltages CV<1:3> of the logic high level in response to the logic high level of the enable signal EN, and the fourth to eighth flip-flops F/F43 to F/F47 of the comparison signal output section 411 transfers the fourth to eighth comparison voltages CV<4:8> of the logic low level in response to the logic high level of the enable signal EN.

The first AND gate AD40 of the comparison signal output section 411 performs an AND operation on the logic high level of the first comparison voltage CV<1> and the inverted and buffered logic level (i.e., the logic low level) of the second comparison voltage CV<2>, and generates the first comparison signal COMP<1> having a logic low level. The second AND gate AD41 performs an AND operation on the logic high level of the second comparison voltage CV<2> and the inverted and buffered logic level (i.e., the logic low level) of the third comparison voltage CV<3>, and generates the second comparison signal COMP<2> having a logic low level. The third AND gate AD42 performs an AND operation on the logic high level of the third comparison voltage CV<3> and the inverted and buffered logic level (i.e., the logic high level) of the fourth comparison voltage CV<4>, and generates the third comparison signal COMP<3> having a logic high level. The fourth AND gate AD43 performs an AND operation on the logic low level of the fourth comparison voltage CV<4> and the inverted and buffered logic level (i.e., the logic high level) of the fifth comparison voltage CV<5>, and generates the fourth comparison signal COMP<4> having a logic low level. The fifth to seventh AND gates AD44 to AD46 perform the AND operation in the same manner as the fourth AND gate AD43, and generate the fourth to seventh comparison signals COMP<4:7> having a logic low level. That is, the comparison voltages CV<1:8> of "L, L, H, L, L, L, L, L" are generated as shown in Table 2 above as in the case in which the power supply voltage VDD is 1.8 V and the reference voltage VREF is 1.0 V. This means that the first comparison COMP<1> is "L", the second comparison signal COMP<2> is "L", the third comparison signal COMP<3> is "H", the fourth comparison signal COMP<4> is "L", the fifth comparison signal COMP<5> is "L", the sixth comparison signal COMP<6> is "L", the seventh comparison signal COMP<7> is "L", and the eighth comparison signal COMP<8> is "L".

The decoder 42 decodes the comparison signals COMP<1:8> of "L, L, H, L, L, L, L, L" and the driving strength signals STCTRL<1:3> of "H, L, L" having the weak driving strength information, and generates the first control signal CON<1> of "H" and the second control signal CON<2> of "L" as shown in Table 3 above.

The first transfer section 510 of the pull-up driving signal generation unit 51 receives the first control signal CON<1> of the logic high level "H" and the second control signal CON<2> of the logic low level "L". Thus, the tenth inverter IV50 is driven and the eleventh inverter IV51 is not driven. The first transfer section 510 inverts and buffers the pre-pull-up driving signals PRE_PU<1:3> of "L, L, L" with the second driving strength and outputs the pull-up driving signals PU<1:3> whose driving strength is adjusted to be lower than the first driving strength. The twelfth inverter IV52 of the second transfer section 511 inverts and buffers the pre-pull-up driving signals PRE_PU<1:3> of "L, L, L" with the third driving strength and outputs the pull-up driving signals PU<1:3> of "H, H, H" whose driving strength is adjusted to the lowest level. The pull-up driving signals PU<1:3> of "H, H, H" are outputted by mixing the pull-up driving signals PU<1:3> of "H, H, H" having the second driving strength and the pull-up driving signals PU<1:3> of "H, H, H" having the third driving strength.

The third transfer section 520 of the pull-down driving signal generation unit 52 receives the first control signal CON<1> of the logic high level "H" and the second control signal CON<2> of the logic low level "L". Thus, the thirteenth inverter IV53 is driven and the fourteenth inverter IV54 is not driven. The third transfer section 520 inverts and buffers the pre-pull-down driving signals PRE_PD<1:3> of "L, H, H" with the second driving strength, and outputs the pull-down driving signals PD<1:3> whose driving strength is adjusted to be lower than the first driving strength. The fifteenth inverter IV55 of the fourth transfer section 521 inverts and buffers the pre-pull-down driving signals PRE_PD<1:3> of "L, H, H" with the third driving strength, and outputs the pull-down driving signals PD<1:3> of "H, L, L" whose driving strength is adjusted to the lowest level. The pull-down driving signals PD<1:3> of "H, L, L" are outputted by mixing the pull-down driving signals DU<1:3> of "H, L, L" having the second driving strength and the pull-down driving signals PD<1:3> of "H, L, L" having the third driving strength.

The pull-up driving unit 61 of the driving unit 60 does not pull up the voltage of the node nd60 because the first to third pull-up elements P60 to P62 are not driven in response to the pull-up driving signals PU<1:3> of "H, H, H", whose driving strength is adjusted to the mixture of the second and third driving strengths.

The pull-down driving unit 62 does not drive the second and third pull-down elements N61 and N62 in response to the pull-down driving signals PD<1:3> of "H, L, L", whose driving strength is adjusted to the mixture of the second and third driving strengths, and the first pull-down element N60 pull down the voltage of the node nd60 with the mixed driving strength of the second and third driving strengths and outputs the output data having the logic low level.

As described above, the output driver generates the control signals CON<1:2> by using the power supply voltage VDD and the driving strength signals STCTRL<1:3> changing the slew rate of the output data Dout, and adjusts the driving strength of the driving signals PU<1:3> and PD<1:3> whose driving strengths are adjusted according to the level of the control signals CON<1:2>. Since the driving unit 60 is driven by the driving signals whose driving strength is adjusted, the slew rate may be maintained more constantly. Consequently, the output data Dout may be outputted stably, and thus a distortion of the waveform of the output data may decrease.

Figure 9:
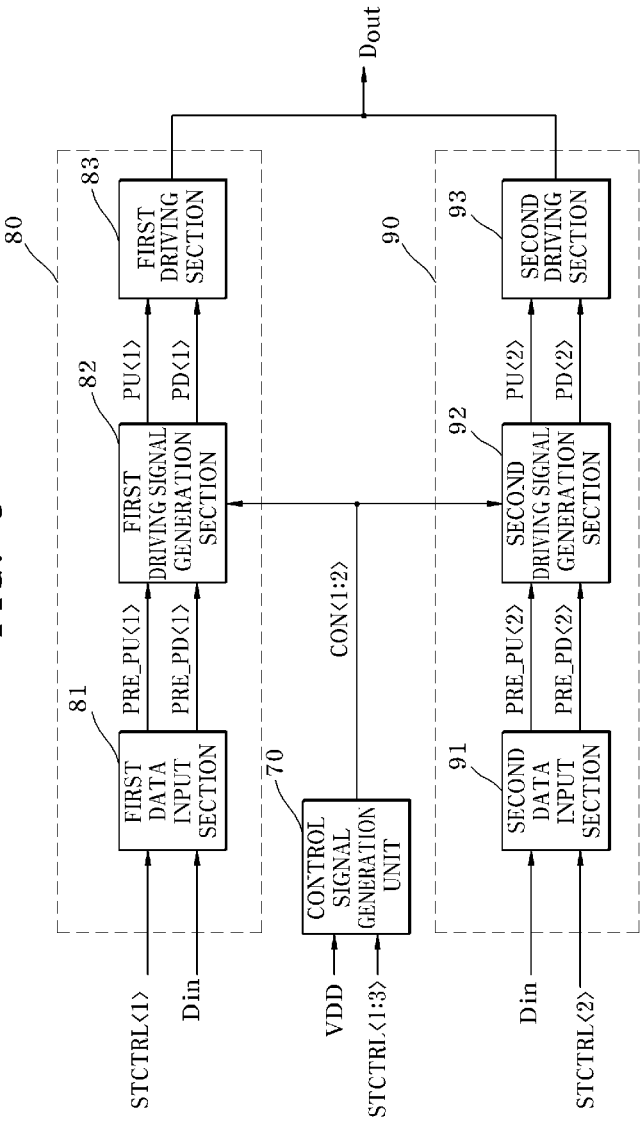
FIG. 9 is a block diagram of an output driver according to another exemplary embodiment of the present invention.

FIG. 9 is a block diagram of an output driver according to another exemplary embodiment of the present invention.

As illustrated in FIG. 9, the output driver according to the exemplary embodiment of the present invention includes a control signal generation 70, a first data driving unit 80, and a second data driving unit 90.

The control signal generation unit 70 is configured to generate control signals CON<1:2>, whose driving strength is adjusted, in response to driving strength signals STCTRL<1:3> and a power supply voltage VDD. The control signal generation unit 70 may be implemented with the same configuration as that of FIG. 5.

The first data driving unit 80 includes a first data input section 81, a first driving signal generation section 82, and a first driving section 83.

The first data input section 81 is configured to buffer input data Din in response to a logic high level of the first driving strength signal STCTRL<1>, and generate first pre-driving signals PRE_PU<1> and PRE_PD<1>. The first data input section 81 may be implemented with the same circuit as that of FIG. 4. The first driving strength signal STCTRL<1> is a signal which is enabled to a logic high level when the driving strength is weak.

The first driving signal generation section 82 is configured to invert and buffer the first pre-driving signals PRE_PU<1> and PRE_PD<1> in response to the control signals CON<1: 2>, and generate first driving signals PU<1> and PD<1> whose driving strength is adjusted. The first driving signal generation section 82 may be implemented with the same circuit as that of FIG. 7.

The first driving section 83 is configured to pull-up or pull-down the voltage of the output data Dout in response to the logic level of the first driving signals PU<1> and PD<1>, and output the output data Dout whose driving strength is adjusted.

The operation of the first data driving unit 80 will be described below on the assumption that the input data Din of a logic low level is inputted, the first driving strength STCTRL<1> having the weak driving strength information is enabled to a logic high level, the power supply voltage VDD is 1.4 V, and the reference voltage VREF is 1.0 V.

The control signal generation unit 70 generates the comparison signals COMP<1:8> of "L, H, L, L, L, L, L, L" as shown in Table 2 above as in the case in which the power supply voltage VDD is 1.4 V and the reference voltage VREF is 1.0 V, and generates the control signals CON<1:2> of "H, H" as shown in Table 4 by decoding the comparison signals COMP<1:8> of "L, H, L, L, L, L, L, L" and the driving strength signals STCTRL<1:3> "H, L, L" having the weak driving strength information as shown in Table 3 above.

The first data input section 81 buffers the logic low level "L" of the input data Din in response to the logic high level of the first driving strength signal STCTRL<1>, and outputs the first pre-driving signals PRE_PU<1> and PRE_PD<1> of "L, L".

The first driving signal generation section 82 inverts and buffers the first pre-driving signals PRE_PU<1> and PRE_PD<1> of "L, L" in response to the control signals CON<1:2> of "H, H", and generates the first driving signals PU<1> and PD<1> of "H, H" whose driving strength is adjusted to the highest level, that is, the first driving strength.

The first driving section 83 pulls down the voltage of the output data Dout in response to the first driving signals PU<1> and PD<1> of "H, H" and output the output data Dout of "L" whose driving strength is adjusted to the highest level.

The second data driving unit 90 includes a second data input section 91, a second driving signal generation section 92, and a second driving section 93.

The second data input section 91 is configured to buffer input data Din in response to a logic high level of the second driving strength signal STCTRL<2>, and generate second pre-driving signals PRE_PU<2> and PRE_PD<2>. The second data input section 91 may be implemented with the same circuit as that of FIG. 4. The second driving strength signal STCTRL<2> is a signal which is enabled to a logic high level when the driving strength is half.

The second driving signal generation section 92 is configured to invert and buffer the second pre-driving signals PRE_PU<2> and PRE_PD<2> in response to the control signals CON<1:2>, and generate second driving signals PU<2> and PD<2> whose driving strength is adjusted. The second driving signal generation section 92 may be implemented with the same circuit as that of FIG. 7.

The second driving section 93 is configured to pull-up or pull-down the voltage of the output data Dout in response to the logic level of the second driving signals PU<2> and PD<2>, and output the output data Dout whose driving strength is adjusted.

The operation of the second data driving unit 90 will be described below on the assumption that, the input data Din of a logic low level is inputted, the second driving strength STCTRL<2> having the half driving strength information is enabled to a logic high level, the power supply voltage VDD is 1.4 V, and the reference voltage VREF is 1.0 V.

The control signal generation unit 70 generates the comparison signals COMP<1:8> of "L, H, L, L, L, L, L, L" as shown in Table 2 above as in the case in which the power supply voltage VDD is 1.4 V and the reference voltage VREF is 1.0 V, and generates the control signals CON<1:2> of "H, L" as shown in Table 4 by decoding the comparison signals COMP<1:8> of "L, H, L, L, L, L, L, L" and the driving strength signals STCTRL<1:3> of "L, H, L" having the half driving strength information as shown in Table 3 above.

The second data input section 91 buffers the logic low level "L" of the input data Din in response to the logic high level of the second driving strength signal STCTRL<1>, and outputs the second pre-driving signals PRE_PU<2> and PRE_PD<2> of "L, L".

The second driving signal generation section 92 inverts and buffers the second pre-driving signals PRE_PU<2> and PRE_PD<2> of "L, L" in response to the control signals CON<1:2> of "H, L", and generates the second driving signals PU<2> and PD<2> of "H, H" whose driving strength is adjusted to be lower than the first driving strength and higher than the third driving strength.

The second driving section 93 pull-down drives the output data Dout in response to the second driving signals PU<2> and PD<2> of "H, H", and output the output data Dout of "L" whose driving strength is adjusted to be lower than the first driving strength and higher than the third driving strength.

As described above, the output driver outputs the output data Dout by adjusting the driving strength in response to the first and second driving strength signals STCTRL<1> and STCTRL<2> having different driving strength information and the level of the power supply voltage VDD. Specifically, the output data Dout whose driving strength is adjusted to the highest level is generated by adjusting the weak driving strength the first driving strength. In addition, the output data Dout whose driving strength is adjusted to be lower than the first driving strength and higher than the third driving strength is generated by adjusting the half driving strength to the second driving strength which is lower than the first driving strength.

The output driver according to the exemplary embodiment of the present invention adjusts the slew rate of the output data Dout by compensating for the difference of the driving strengths, and stably generates the output data Dout with the constant slew rate, and thus a distortion of the waveform of the output data may decrease.

The exemplary embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An output driver comprising:
a control signal generation unit configured to generate a control signal in response to a driving strength signal and a power supply voltage level;
a driving signal generation unit configured to buffer a pre-driving signal and generate a driving signal for driving an output data, wherein a driving strength of the driving signal is adjusted in response to the control signal; and
a data input unit configured to buffer input data according to a level of the driving strength signal, and generate the pre-driving signal.

2. The output driver of claim 1, wherein the data input unit comprises:
a pre-pull-up driving signal generation unit configured to buffer the input data in response to the driving strength signal and output a pre-pull-up driving signal; and
a pre-pull-down driving signal generation unit configured to buffer the input data in response to the driving strength signal and output a pre-pull-down driving signal.

3. The output driver of claim 1, wherein the pre-driving signal is disabled when the driving strength signal is disabled.

4. The output driver of claim 1, wherein the control signal generation unit comprises:
a comparison signal generation unit configured to generate a comparison signal according to the power supply voltage level and a reference voltage level in response to an enable signal; and
a decoder configured to decode the comparison signal and the driving strength signal, and generate the control signal.

5. The output driver of claim 4, wherein the enable signal is enabled during a period in which at least one of first to third driving strength signals is enabled in a mode register set.

6. The output driver of claim 4, wherein the comparison signal generation unit comprises:
a comparison section configured to generate a comparison voltage by comparing the reference voltage with division voltages generated by dividing the power supply voltage through a plurality of resistors; and
a comparison signal output section configured to generate the comparison signal according to the level of the comparison voltage in response to the enable signal.

7. The output driver of claim 1, wherein the driving signal generation unit comprises:
a pull-up driving signal generation unit configured to buffer a pre-pull-up driving signal according to the level of the control signal, and generate a pull-up driving signal whose driving strength is adjusted to first to third driving strengths; and
a pull-down driving signal generation unit configured to buffer a pre-pull-down driving signal according to the level of the control signal, and generate a pull-down driving signal whose driving strength is adjusted to the first to third driving strengths.

8. The output driver of claim 7, wherein the pull-up driving signal generation unit comprises:
a first transfer section configured to be driven in response to the level of the control signal, buffer the pre-pull-up driving signal and generate the pull-up driving signal whose driving strength is adjusted to the first driving strength or the second driving strength; and
a second transfer section configured to buffer the pre-pull-up driving signal and generate the pull-up driving signal whose driving strength is adjusted to the third driving strength.

9. The output driver of claim 7, wherein the pull-down driving signal generation unit comprises:
a third transfer section configured to be driven in response to the level of the control signal, buffer the pre-pull-down driving signal and generate the pull-down driving signal whose driving strength is adjusted to the first driving strength or the second driving strength; and
a fourth transfer section configured to buffer the pre-pull-down driving signal and generate the pull-down driving signal whose driving strength is adjusted to the third driving strength.

10. The output driver of claim 7, wherein the first driving strength is higher than the second driving strength, and the third driving strength is lower than the second driving strength.

11. The output driver of claim 8, wherein the pull-up driving signal is generated by mixing the output of the first transfer section and the output of the second transfer section.

12. The output driver of claim 9, wherein the pull-down driving signal is generated by mixing the output of the third transfer section and the output of the fourth transfer section.

13. The output driver of claim 1, further comprising a driving unit configured to drive the output data in response to the driving signal whose driving strength is adjusted.

14. The output driver of claim 13, wherein the driving unit comprises:
- a pull-up driving unit configured to pull up the voltage of a node in response to the pre-pull-up driving signal and output the output data; and
- a pull-down driving unit configured to pull down the voltage of the node in response to the pre-pull-down driving signal and output the output data.

15. An output driver comprising:
- a control signal generation unit configured to generate a control signal in response to a driving strength signal and a power supply voltage level;
- a first data input section configured to buffer a input data in response to a first driving strength signal and generate a first pre-driving signal;
- a first driving signal generation section configured to buffer the first pre-driving signal in response to the control signal and generate a first driving signal whose driving strength is adjusted;
- a first driving section configured to pull up or pull down the voltage of the output data in response to the first driving signal and output the output data; and
- a second data driving unit configured to receive the input data and generate a second driving signal for driving the output data, wherein a driving strength of the second driving signal is adjusted in response to the control signal.

16. The output driver of claim 15, wherein the first data input section comprises:
- a first pre-pull-up driving signal generation section configured to buffer the input data in response to the first driving strength signal and generate a first pre-pull-up driving signal; and
- a first pre-pull-down driving signal generation section configured to buffer the input data in response to the first driving strength signal and generate a first pre-pull-down driving signal.

17. The output driver of claim 15, wherein the first driving signal generation section comprises:
- a first pull-up driving signal generation section configured to generate a first pull-up driving signal whose driving strength is adjusted according to the level of the control signal; and
- a first pull-down driving signal generation section configured to generate a first pull-down driving signal whose driving strength is adjusted according to the level of the control signal.

18. The output driver of claim 15, wherein the first driving section comprises:
- a first pull-up driving section configured to pull up the voltage of a node in response to the first pull-up driving signal and output the output data; and
- a first pull-down driving section configured to pull down the voltage of the node in response to the first pull-down driving signal and output the output data.

19. The output driver of claim 15, wherein the second data driving unit comprises:
- a second data input section configured to buffer the input data in response to a second driving strength signal and generate a second pre-driving signal;
- a second driving signal generation section configured to buffer the second pre-driving signal in response to the control signal and generate a second driving signal whose driving strength is adjusted; and
- a second driving section configured to pull-up or pull-down drive the output data in response to the second driving signal and output the output data.

20. The output driver of claim 19, wherein the second data input section comprises:
- a second pre-pull-up driving signal generation section configured to buffer the input data in response to the second driving strength signal and generate a second pre-pull-up driving signal; and
- a second pre-pull-down driving signal generation section configured to buffer the input data in response to the second driving strength signal and generate a second pre-pull-down driving signal.

21. The output driver of claim 19, wherein the second driving signal generation section comprises:
- a second pull-up driving signal generation section configured to generate a second pull-up driving signal whose driving strength is adjusted according to the level of the control signal; and
- a second pull-down driving signal generation section configured to generate a second pull-down driving signal whose driving strength is adjusted according to the level of the control signal.

22. The output driver of claim 19, wherein the second driving section comprises:
- a second pull-up driving section configured to pull up a voltage of a node in response to the second pull-up driving signal and output the output data; and
- a second pull-down driving section configured to pull down the voltage of the node in response to the second pull-down driving signal and output the output data.

* * * * *